United States Patent
Kitajima et al.

(10) Patent No.: US 8,314,339 B2
(45) Date of Patent: Nov. 20, 2012

(54) CIRCUIT BOARD WITH KNEADED CONDUCTIVE PASTE

(75) Inventors: Masayuki Kitajima, Kawasaki (JP);
Takeshi Ishitsuka, Kawasaki (JP);
Satoshi Emoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 481 days.

(21) Appl. No.: 12/495,860

(22) Filed: Jul. 1, 2009

(65) Prior Publication Data

US 2010/0006325 A1    Jan. 14, 2010

(30) Foreign Application Priority Data

Jul. 10, 2008   (JP) .................. 2008-180698

(51) Int. Cl.
*H05K 1/03* (2006.01)
*H05K 1/09* (2006.01)
(52) U.S. Cl. ........................ 174/255; 174/257
(58) Field of Classification Search .............. 174/255
See application file for complete search history.

(56) References Cited

U.S. PATENT DOCUMENTS

| | | | |
|---|---|---|---|
| 5,079,065 A | * | 1/1992 | Masakazu et al. ............ 428/137 |
| 5,158,708 A | * | 10/1992 | Yamamoto et al. ........... 252/512 |
| 5,281,176 A | * | 1/1994 | Yahagi et al. ................. 439/887 |
| 7,377,032 B2 | * | 5/2008 | Sumi et al. ...................... 29/846 |
| 2001/0043454 A1 | * | 11/2001 | Yoshii et al. ................ 361/321.2 |
| 2009/0044972 A1 | * | 2/2009 | Kitajima et al. .............. 174/257 |
| 2009/0139748 A1 | * | 6/2009 | Hirata et al. .................. 174/250 |

FOREIGN PATENT DOCUMENTS

| | | | |
|---|---|---|---|
| JP | 01143204 A | * | 6/1989 |
| JP | 04-315782 | | 11/1992 |
| JP | 06338393 A | * | 12/1994 |
| JP | 2002-109957 A | | 4/2002 |
| JP | 2003-209338 A | | 7/2003 |
| JP | 2007-066824 | | 3/2007 |

OTHER PUBLICATIONS

Japanese Notification of Reason for Refusal dated May 22, 2012 corresponding to Japanese Patent Application No. 2008-180698 and English translation thereof.

* cited by examiner

*Primary Examiner* — Timothy Thompson
*Assistant Examiner* — Nathan Milakovich
(74) *Attorney, Agent, or Firm* — Squire Sanders (US) LLP

(57) ABSTRACT

A printed wiring board includes a first conductive paste forming a wiring pattern, and a second conductive paste including kneaded first conductive material and second conductive material whose particles are finer than those of the first conductive material.

9 Claims, 9 Drawing Sheets

FIG. 7

| CARBON PASTE | TYPE OF METAL | METAL ADDED WEIGHT % | | | | | | | | | | |
|---|---|---|---|---|---|---|---|---|---|---|---|---|
| | | 0wt% | 10wt% | 20wt% | 30wt% | 40wt% | 50wt% | 60wt% | 70wt% | 80wt% | 90wt% | 100wt% |
| CH-10 MANUFACTURED BY JUJO CHEMICAL CO., LTD. | NICKEL | ×(775mΩ) | ×(785mΩ) | ×(807mΩ) | ○(698mΩ) | ○(565mΩ) | ○(520mΩ) | ○(392mΩ) | ○(346mΩ) | ○(226mΩ) | × NOT PRINTABLE | × NOT PRINTABLE |
| | COPPER | | ×(894mΩ) | ×(787mΩ) | ×(799mΩ) | ○(689mΩ) | ○(576mΩ) | ○(536mΩ) | ○(496mΩ) | ○(467mΩ) | × NOT PRINTABLE | × NOT PRINTABLE |
| | PALLADIUM | | ×(933mΩ) | ○(667mΩ) | ○(566mΩ) | ○(478mΩ) | ○(375mΩ) | ○(102mΩ) | ○(53mΩ) | ○(35mΩ) | × NOT PRINTABLE (28mΩ) | × NOT PRINTABLE |
| | COBALT | | ×(827mΩ) | ×(861mΩ) | ○(742mΩ) | ○(654mΩ) | ○(578mΩ) | ○(494mΩ) | ○(372mΩ) | ○(87mΩ) | × NOT PRINTABLE | × NOT PRINTABLE | ns
CIRCUIT BOARD WITH KNEADED CONDUCTIVE PASTE

CROSS-REFERENCE TO RELATED APPLICATIONS

This application is based upon and claims the benefit of priority of the prior Japanese Patent Application No. 2008-180698, filed on Jul. 10, 2008, the entire contents of which are incorporated herein by reference.

BACKGROUND

1. Field

The embodiments discussed herein are related to a printed wiring board.

2. Description of Related Art

A silver paste, for example, has been used as a material of a wire having low resistance created by being printed on a wiring board. In addition, a technique to cover an internal connector insertion part of a wire, created by printing a silver paste with a carbon paste and other portions with an insulated resistor paste, has been used for the purpose of preventing ion migration of silver contained in the silver paste. Such pastes and techniques are shown, for example, in Japanese Laid-open Patent Publication No. 2007-66824.

SUMMARY

According to an embodiment of the invention, a printed wiring board includes a first conductive paste forming a wiring pattern, and a second conductive paste obtained by kneading a first conductive material and a second conductive material whose particles are finer than those of the first conductive material.

The object and advantages of the invention will be realized and attained by the elements and combinations particularly pointed out in the claims. It is to be understood that both the foregoing general description and the following detailed description are exemplary and explanatory, and are not restrictive of the invention as claimed.

BRIEF DESCRIPTION OF DRAWINGS

The above and other objects, features and advantages of the present invention will become apparent from the following description of the preferred embodiments in conjunction with the accompanying drawings, wherein:

FIG. 7 is a diagram illustrating relations between weight ratios and values of resistance of the metal powder-containing carbon paste in the first embodiment;

DESCRIPTION OF EMBODIMENTS

Embodiments of a printed wiring board, a method for manufacturing a wire, and a conductive paste according to examples of the present invention will be described below in detail, with reference to the attached drawings. An overview of a printed wiring board according to the first embodiment, the configuration of the printed wiring board, relations between carbon powder and metal powder, types of metal, relations between weight ratios and values of resistance, a method for manufacturing the printed wiring board, and effects of the printed wiring board according to the first embodiment will in turn be described below. Then, other embodiments will be described.

Figure 1:
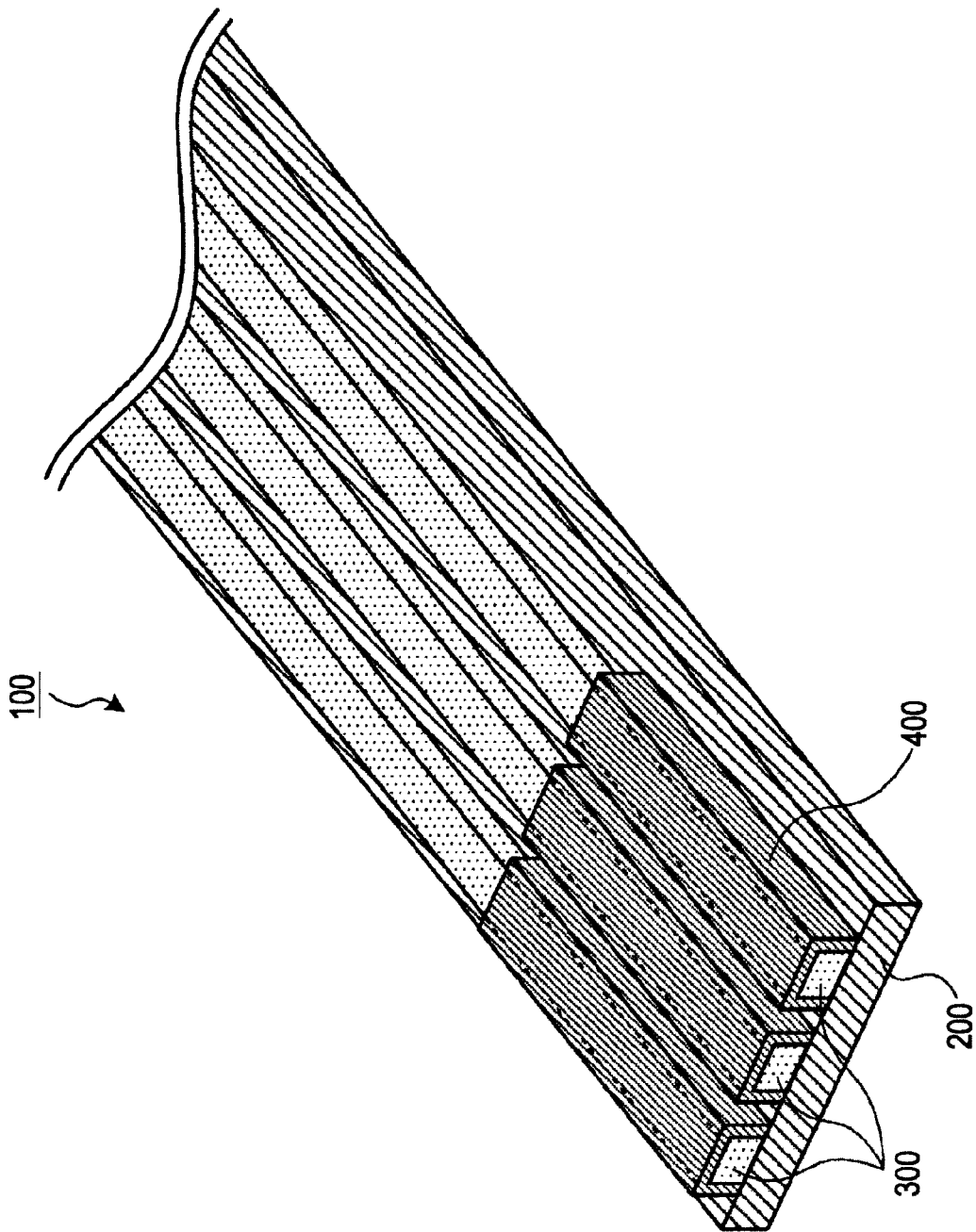
FIG. 1 is a diagram illustrating an overview of a printed wiring board according to a first embodiment.

First, an overview of a printed wiring board 100 according to the first embodiment will be provided using FIG. 1. FIG. 1 is a diagram illustrating an overview of the printed wiring board according to the first embodiment.

In the printed wiring board 100 according to the first embodiment, a wiring pattern printed by a first conductive paste is covered with a second conductive paste. In this example, it is assumed below that the first conductive paste is a silver paste 300. It is also assumed that the second conductive paste is a paste obtained by kneading a first conductive material and a second conductive material whose particles are finer than those of the first conductive material, the first conductive material is carbon powder 10, and the second conductive material is metal powder 20.

As shown in FIG. 1, the silver paste 300 printed on a substrate 200 as a wiring pattern is covered with a metal powder-containing carbon paste 400.

Here, the metal powder-containing carbon paste 400 has, with the metal powder 20 interposed between particles of carbon powder 10, more conduction paths of electricity than a carbon paste in which the metal powder 20 is not kneaded and which is a paste containing only the carbon powder 10. As a result, compared with the carbon paste, the metal powder-containing carbon paste 400 exhibits a lower value of resistance.

Accordingly, compared with a printed wiring board using a carbon paste, the value of resistance of the printed wiring board 100 according to the first embodiment can be reduced. That is, as a paste for covering an internal terminal part of a wiring printed with the silver paste, a carbon paste in which the number of conduction paths of electricity is increased by powder of palladium or the like being incorporated into gaps among particles of carbon powder is used and thus, the value of resistance can be reduced.

Figure 2:
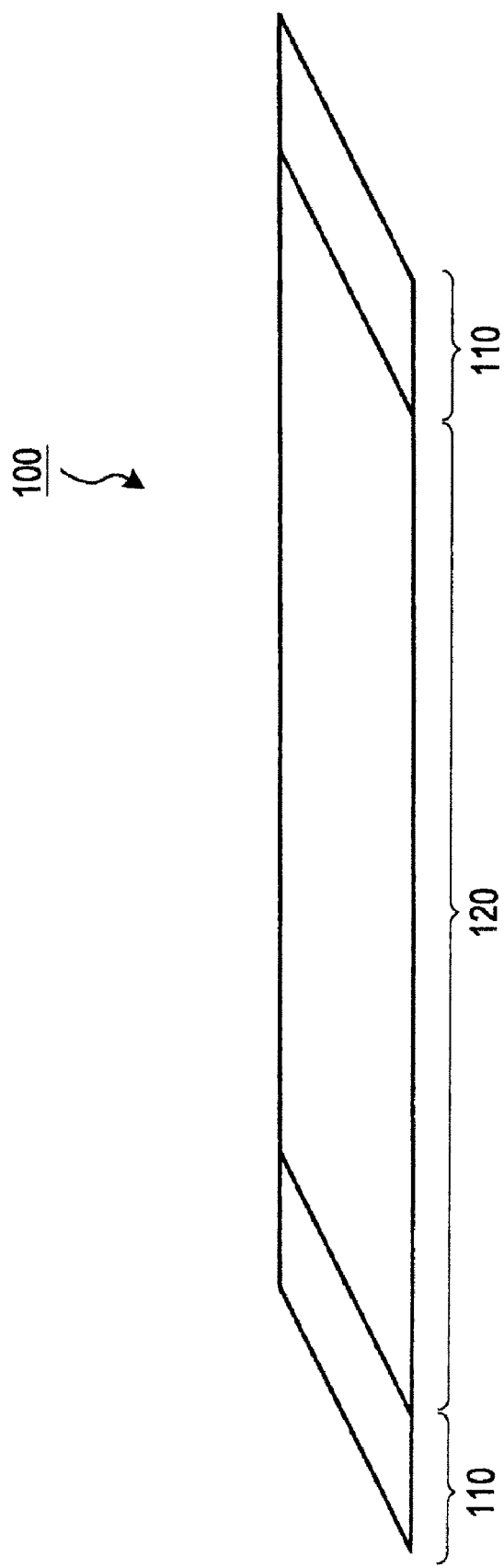
FIG. 2 is a diagram illustrating a configuration of the printed wiring board according to the first embodiment.

Next, the configuration of the printed wiring board 100 shown in FIG. 1 will be described using FIG. 2. FIG. 2 is a diagram illustrating the configuration of the printed wiring board according to the first embodiment. Here, the printed wiring board 100 can be, for example, an elastic cable used in a device with little free space such as a mobile information device.

The printed wiring board 100 can have a connector insertion part 110 and a cable part 120, which are physically connected. More specifically, the connector insertion parts 110 are positioned on both sides of the cable part 120 in the printed wiring board 100. The printed wiring board 100 is a cable that physically transmits an electric signal and more specifically, transmits an electric signal from one of the connector insertion parts 110 to the other connector insertion part 110 via the cable part 120.

The printed wiring board 100 connects, for example, components provided inside a mobile information device and is, for example, a cable conforming to the USB 2.0 (Universal Serial Bus 2.0) standard, or other standard.

Figure 3:
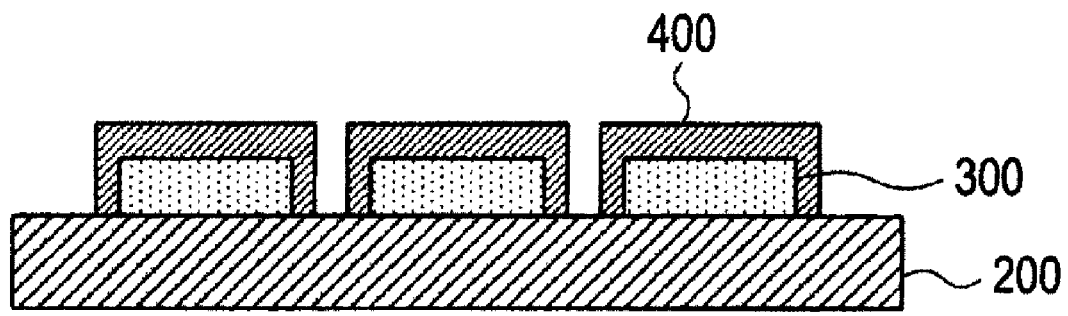
FIG. 3 is a diagram illustrating a sectional configuration of a connector insertion part in the first embodiment.

The connector insertion part 110 can be, of the substrate 200 on which the silver paste 300 is printed, a portion that is inserted into a connector of another device or the like. As shown in FIG. 3, the connector insertion part 110 includes the substrate 200, the silver paste 300 printed on the substrate 200 as a wiring pattern, and the metal powder-containing carbon paste 400 that covers the silver paste 300. FIG. 3 is a diagram illustrating a sectional configuration of a connector insertion part in the first embodiment.

The substrate 200 can be a base material on which the silver paste 300 is printed. For example, a smooth resin film can be used. The substrate 200 is, for example, a PET (polyethylene terephthalate) sheet whose thickness can be "0.1 mm". A concrete example thereof is a Diafoil polyester film "ST100 type=100" manufactured by Mitsubishi Polyester Film.

The silver paste 300 is a conductive paste printed as a wiring pattern and an electric signal is transmitted via the silver paste 300 printed as a wiring pattern.

In this embodiment, the metal powder-containing carbon paste 400 prevents ion migration by metal contained in a wiring pattern and also adds abrasion resistance to the connector insertion part 110. More specifically, the metal powder-containing carbon paste 400 can prevent ion migration by silver contained in the silver paste 300.

The metal powder-containing carbon paste 400 is, for example a paste obtained by kneading a conductive material and the metal powder 20 of particles finer than the conductive material. More specifically, a conductive paste can be obtained by kneading the carbon powder 10 and the metal powder 20 of particles finer than the carbon powder 10.

The metal powder 20 to be kneaded with the carbon powder 10 is kneaded for the purpose of reducing the value of resistance of the metal powder-containing carbon paste 400. Relations between the carbon powder 10 and the metal powder 20 will be described below.

The ion migration is a phenomenon in which a metal used as a material of wiring is ionized by action of an electric field and then, deposited after being moved between electrodes and reduced to the metal, causing, as a result, insulation deterioration. For example, silver contained in a silver paste emits electrons to become "Ag+" and dissolves from a wire and then, accepts a charge from an opposite wiring pattern to revert to "Ag" and is deposited before dendrite is generated. Then, silver contained in the silver paste forms a wire of silver to the opposite wire pattern by growing the dendrite through repeated ionization and deposition and, as a result, a short circuit or insulation deterioration is caused.

Figure 4:
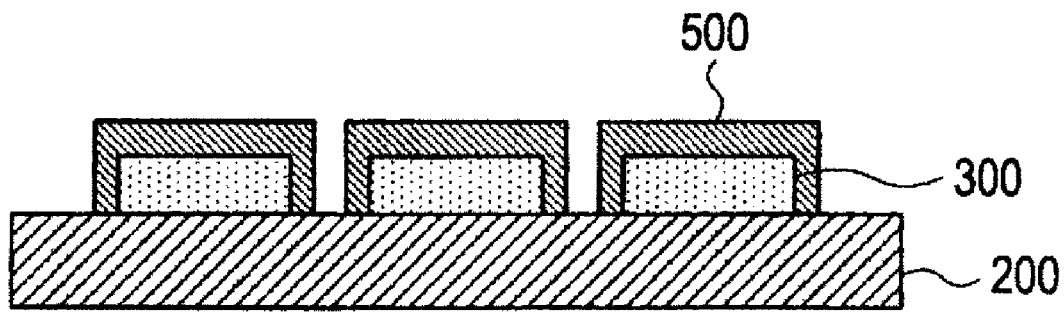
FIG. 4 is a diagram illustrating the sectional configuration of a cable part in the first embodiment.

The cable part 120 is a portion of the printed wiring board 100 excluding the connector insertion part 110 and has, for example, as shown in FIG. 4, the substrate 200, the silver paste 300 printed on the substrate 200 as a wiring pattern, and an insulated resistor paste 500 covering the silver paste 300. FIG. 4 is a diagram illustrating the sectional configuration of a cable part in the first embodiment.

Relations between the carbon powder 10 and the metal powder 20 will be described. The carbon powder 10 is ground to a size of about 1 μm in diameter and then, immediately condenses to powder of about 40 μm in diameter. In the metal powder-containing carbon paste 400, the metal powder 20 whose diameter is 25 μm or less is kneaded and, for example, the metal powder 20, which can be obtained by atomization using a device such as a jet mill, is kneaded.

A jet mill is a device that grinds material to powder and causes a high-pressure air or vapor jetted out from a nozzle to collide against particles to thereby grind particles to fine particles of up to several micrometers by collision of particles.

Figure 5:
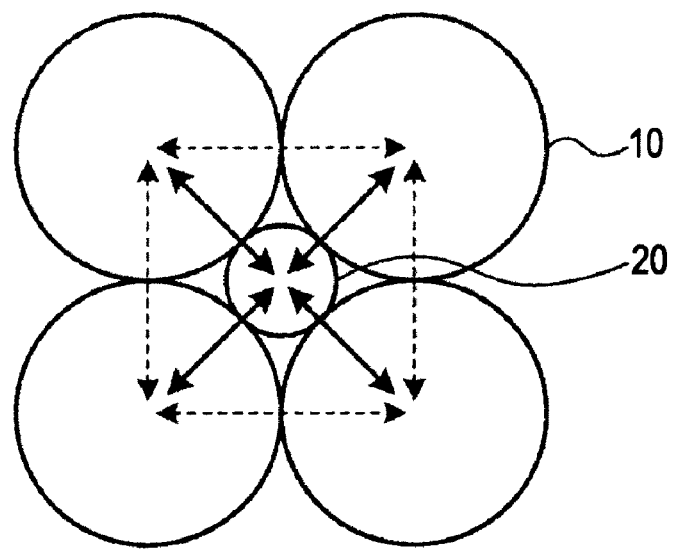
FIG. 5 is a diagram illustrating conduction paths present in a carbon paste in the first embodiment.

As illustrated in FIG. 5, in the metal powder-containing carbon paste 400, when the carbon powder 10 and the metal powder 20 are kneaded, the metal powder 20 can be incorporated into gaps among particles of the carbon powder 10. Then, the carbon powder 10 and the metal powder 20 come into contact with each other in the metal powder-containing carbon paste 400. FIG. 5 is a diagram illustrating conduction paths present in the metal powder-containing carbon paste in the first embodiment.

Accordingly, compared with carbon paste, the number of conduction paths of electricity increases in the metal powder-containing carbon paste 400 to exhibit a lower value of resistance. The diameter of metal powder of 25 μm or less is a size intended for the metal powder 20 to be incorporated into gaps among particles of the carbon powder 10.

Figure 6:
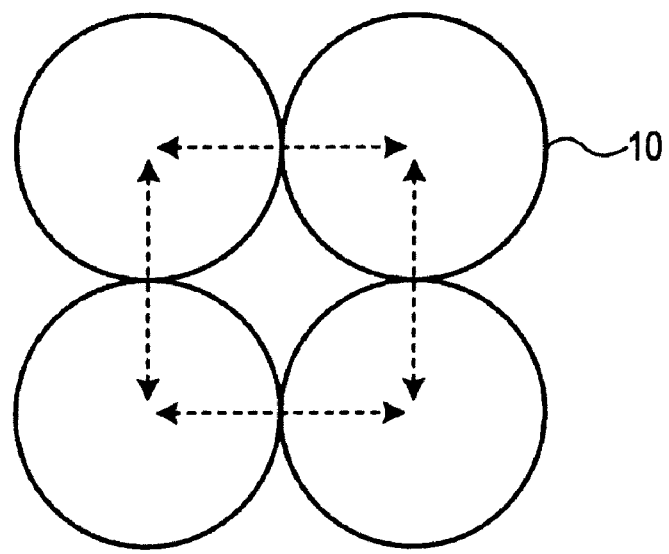
FIG. 6 is a diagram illustrating conduction paths present in the metal powder-containing carbon paste in the first embodiment.

That is, as shown in FIG. 6, a particle of the carbon powder 10 and an adjacent particle of the carbon powder 10 are in point contact in carbon paste. As shown by dotted lines in FIG. 6, one particle of the carbon powder 10 is in contact with each of two other particles of the carbon powder 10 at one point. FIG. 6 is a diagram illustrating conduction paths present in the carbon paste in the first embodiment.

In contrast, in the metal powder-containing carbon paste 400, as shown by dotted lines in FIG. 5, one particle of the carbon powder 10 is in contact with each of two other particles of the carbon powder 10 at one point. Also, in the metal powder-containing carbon paste 400, as shown by solid lines in FIG. 5, one particle of the carbon powder 10 is in contact with three other particles of the carbon powder 10 via the metal powder 20 including two other particles of the carbon powder 10 in contact at one point. As a result, compared with carbon paste, the number of conduction paths of electricity increases in the metal powder-containing carbon paste 400 to exhibit a lower value of resistance.

Dotted lines in FIG. 5 show conduction paths between particles of carbon powder, and solid lines in FIG. 5 show conduction paths newly increased by kneading the metal powder 20.

Types of metal used as the metal powder 20 will be described. In the metal powder-containing carbon paste 400, as the metal powder 20, those types of metal that are less likely to cause ion migration than silver can be used. For example, nickel, copper, palladium, cobalt, a mixture or alloy of a plurality of types of metal or a mixture of a plurality of alloys is used as the types of the metal powder 20 in the metal powder-containing carbon paste 400.

Here, the meaning of using metal less likely to cause ion migration than silver as the metal powder 20 will be described. One object of placing the metal powder-containing carbon paste 400 on the silver paste 300 printed as a wiring pattern is to prevent ion migration of silver, which is a metal contained in the wiring pattern.

Relations between weight ratios and values of resistance of the metal powder 20 and the carbon powder 10 will be described using FIG. 7. FIG. 7 is a diagram illustrating relations between weight ratios and values of resistance of the metal powder-containing carbon paste in the first embodiment.

To describe the weight ratio and value of resistance, a "metal added weight %" indicating the weight ratio of the metal powder 20 and the carbon paste is used for convenience of description. In the example shown in FIG. 7, for example, the metal added weight % "10 wt %" indicates that the weight ratio of the metal powder 20 and the carbon paste is "10:90".

In FIG. 7, an example is illustrated wherein CH-10 manufactured by Jujo Chemical Co., Ltd. (registered trademark) is used as the carbon paste, and also wherein nickel, copper, palladium, and cobalt are used as the metal powder 20.

In FIG. 7, "O" indicates that each value of resistance measured for each "metal added weight %" of the metal powder-containing carbon paste 400 is lower than that measured for the carbon paste, and "X" indicates that the former value of resistance is higher. As shown in parentheses in FIG. 7, each value of resistance actually measured is shown. Also, if the metal powder-containing carbon paste 400 cannot be printed, that is, the metal powder-containing carbon paste 400 cannot be applied by printing for the purpose of placing the metal powder-containing carbon paste 400 on a wiring pattern, "Not printable" is shown.

Each value of resistance shown in FIG. 7 is a value of resistance obtained by measuring the metal powder-containing carbon paste 400 having a length of "52 mm", a width of "1 mm", and a thickness of "0.02 mm" and heat-treated at 140° C. for 40 minutes after a wiring pattern is formed.

Figure 8:
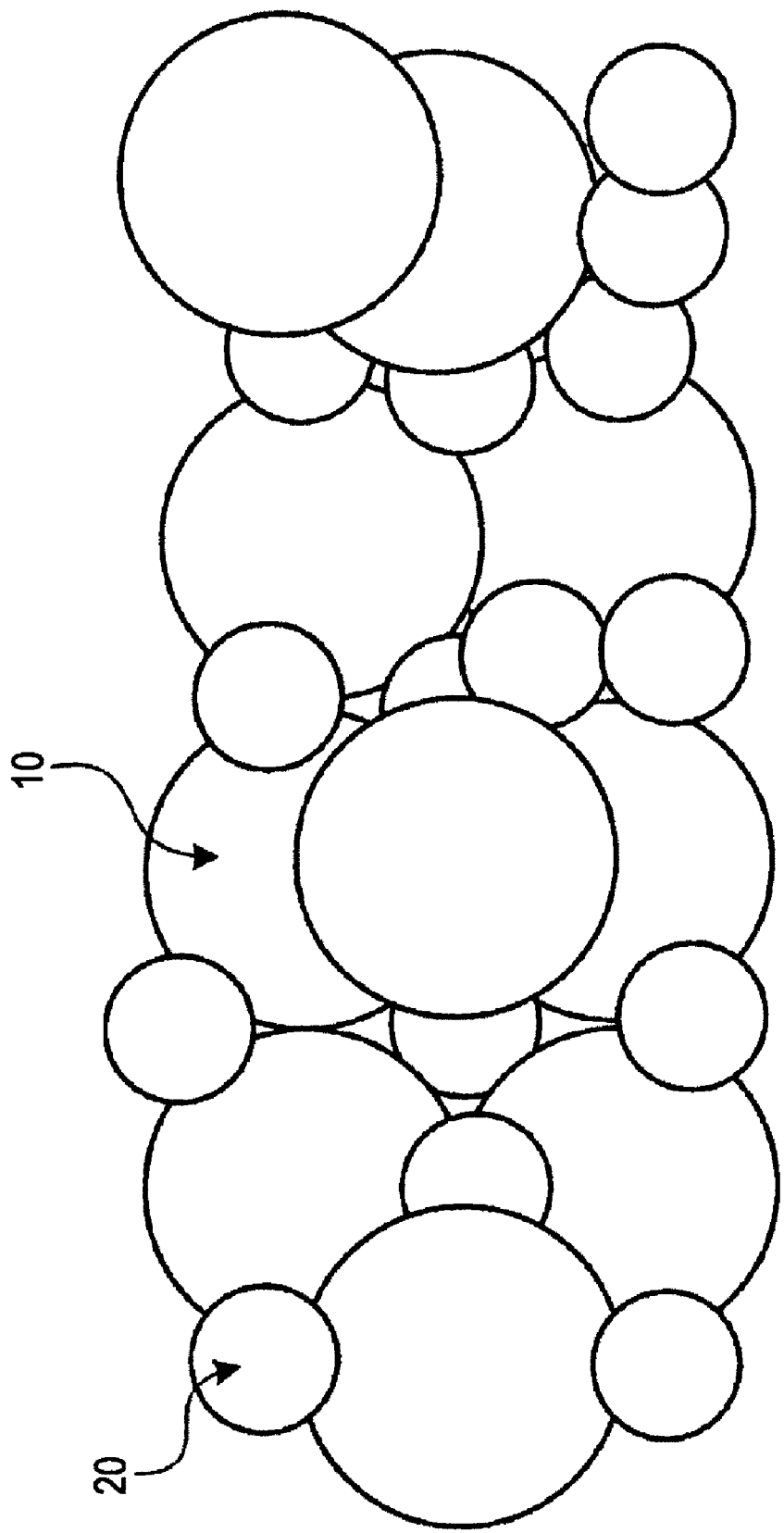
FIG. 8 is a diagram exemplifying a three-dimensional configuration of carbon powder and metal powder kneaded in the metal powder-containing carbon paste in the first embodiment.
Figure 9:
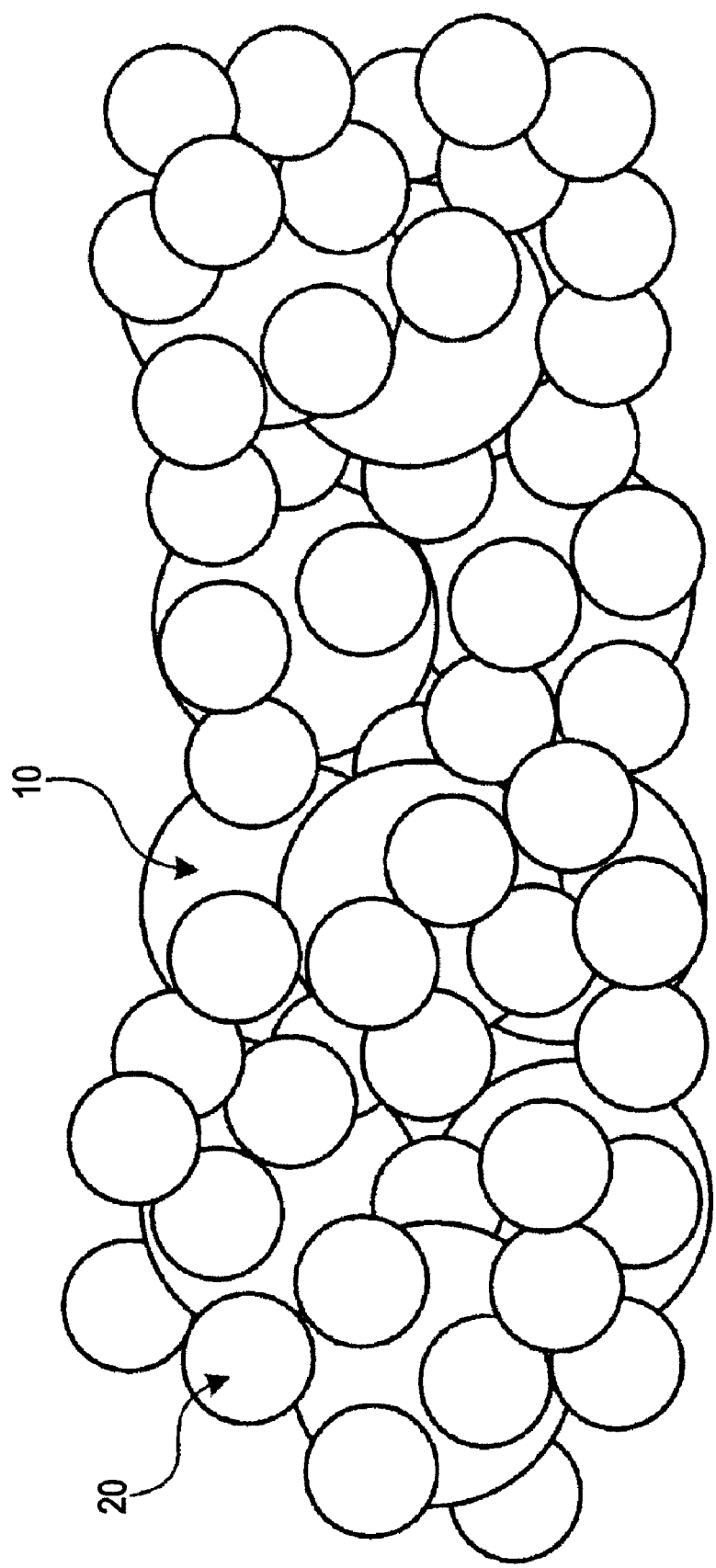
FIG. 9 is a diagram exemplifying the three-dimensional configuration of the carbon powder and metal powder kneaded in the metal powder-containing carbon paste in the first embodiment.

As shown in FIG. 7, the value of resistance of the metal powder-containing carbon paste 400 decreases with an increasing "metal added weight %". This is because, as shown in FIGS. 8 and 9, the number of conduction paths of electricity in the metal powder-containing carbon paste 400 increases with an increase in the ratio of the metal powder 20 to the carbon paste in the metal powder-containing carbon paste 400. FIGS. 8 and 9 are diagrams exemplifying the three-dimensional configuration of carbon powder and metal powder kneaded in the metal powder-containing carbon paste in the first embodiment.

That is, the metal powder-containing carbon paste 400 shown in FIG. 9 has more conduction paths of electricity than the metal powder-containing carbon paste 400 shown in FIG. 8 due to a higher ratio of the metal powder 20 to the carbon paste and, as a result, the value of resistance of the carbon paste shown in FIG. 9 decreases.

As shown in FIG. 7, there is an appropriate range of weight ratio for each type of metal and if, for example, the metal powder 20 is palladium, "O" is shown when the "metal added weight %" is "20 wt %" to "80 wt %", which is an appropriate range of weight ratio. In other words, if the metal powder 20 is palladium and the metal added weight % is "10 wt %", only a higher value of resistance is obtained than when only the carbon paste is used and thus, the weight ratio belongs to an inappropriate range. If the metal powder 20 is palladium and the metal added weight % is "80 wt %" or more, the metal powder-containing carbon paste 400 becomes "not printable" and the weight ratio belongs to an inappropriate range.

In the example shown in FIG. 7, the lowest value of resistance is measured, among nickel, copper, palladium, and cobalt, when palladium is used compared with the three other metals.

Figure 10:
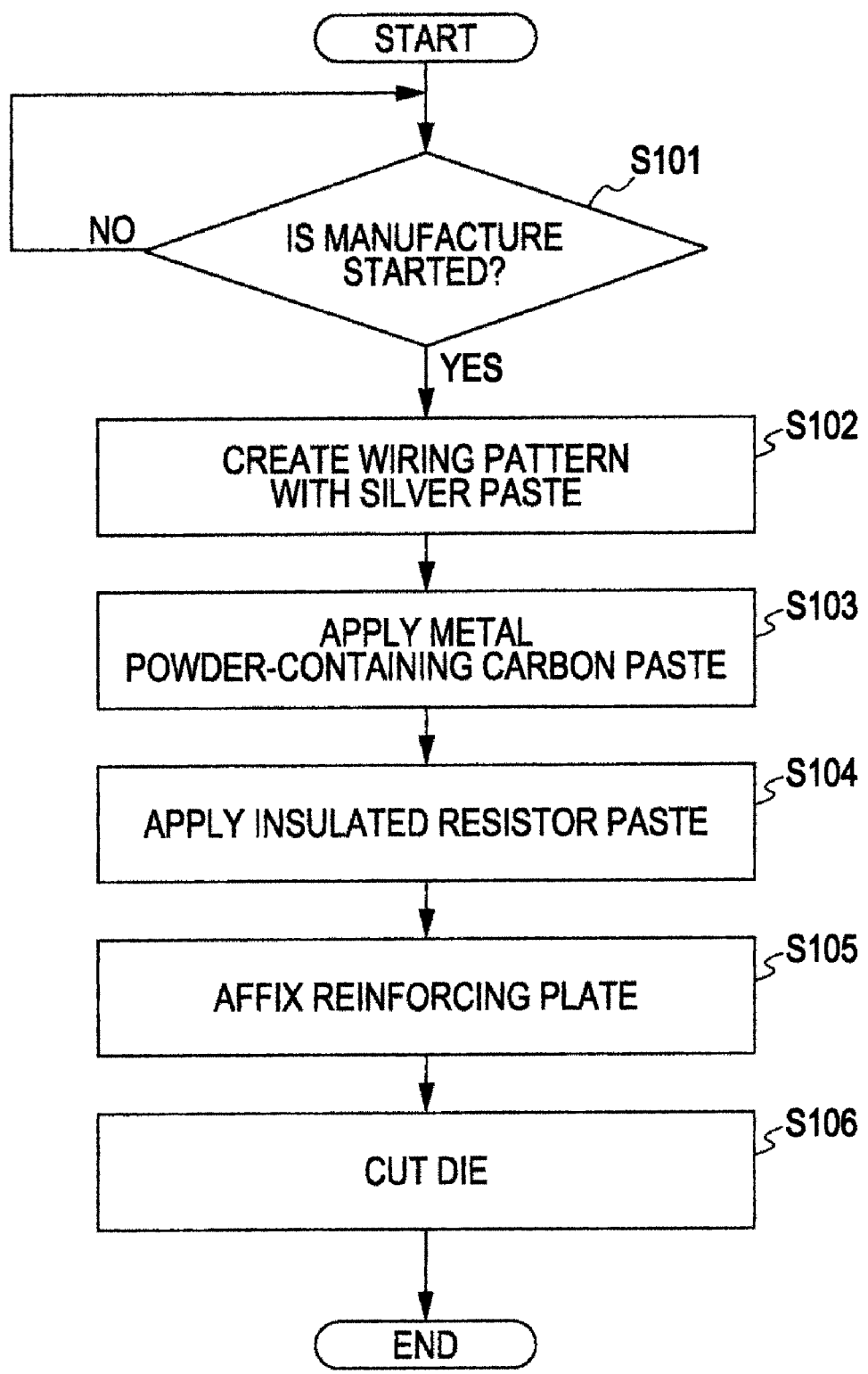
FIG. 10 is a flow chart exemplifying a flow of processing to manufacture the printed wiring board in the first embodiment.
Figure 11A:
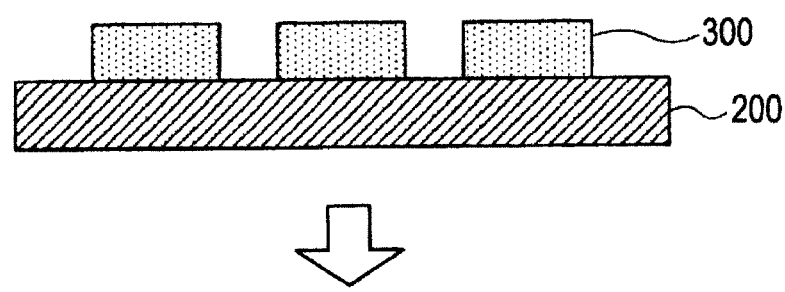
FIG. 11A is a diagram exemplifying the flow of processing to manufacture the printed wiring board in the first embodiment.

Next, a method for manufacturing the printed wiring board 100 will be described using FIGS. 10 to 11. A manufacturing method when a reinforcing plate is attached, which is a material to reinforce the connector insertion part 110, will be described below. FIG. 10 is a flow chart exemplifying a flow of processing to manufacture the printed wiring board in the first embodiment. FIGS. 11A to 11C are diagrams exemplifying the flow of processing to manufacture the printed wiring board in the first embodiment.

As shown in FIG. 10, when manufacture starts (step S101, Yes), a production unit creates a wiring pattern using the silver paste 300 (step S102). That is, as shown in FIG. 11A, the silver paste 300 can be printed on the substrate 200 as a wiring pattern.

For example, the production unit can print the silver paste 300 on the substrate 200 using a screen printing plate and then, heat-treats the silver paste 300 at 140° C. for 40 minutes. Printing using a screen printing plate is a kind of stencil printing and is a printing method by which gauze is used as a pattern support material and printing ink is caused to transfer to a printed body through a print image created thereon for image reproduction. For example, a nylon mesh can be used as the screen printing plate.

Then, the production unit applies the metal powder-containing carbon paste 400 (step S103). That is, the production unit places the metal powder-containing carbon paste 400 on a portion to be the connector insertion part 110 of the silver paste 300 printed as a wiring pattern.

Figure 11B:
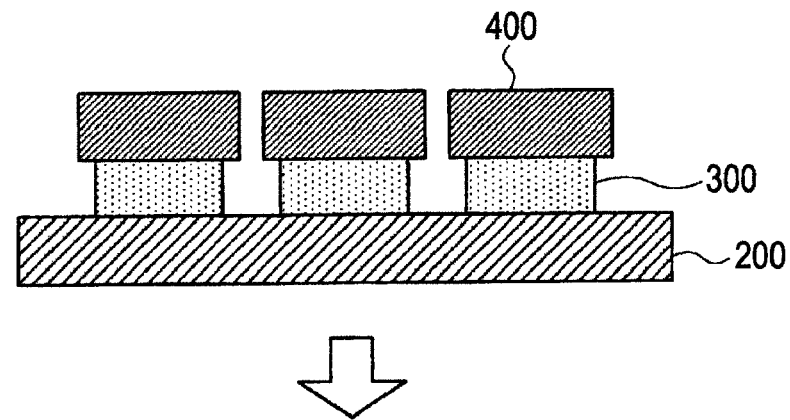
FIG. 11B is a diagram exemplifying the flow of processing to manufacture the printed wiring board in the first embodiment.
Figure 11C:
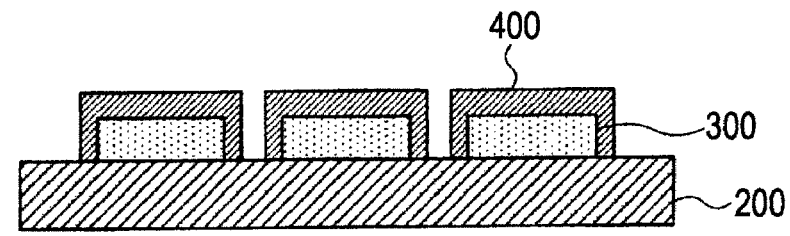
FIG. 11C is a diagram exemplifying the flow of processing to manufacture the printed wiring board in the first embodiment.

For example, as shown in FIG. 11B, the production unit prints the metal powder-containing carbon paste 400, using a screen printing plate, on the silver paste 300 printed on the substrate 200 as a wiring pattern. Then, as shown in FIG. 11C, the production unit places the metal powder-containing carbon paste 400 on a portion to be the connector insertion part 110 of the silver paste 300 by heat-treating the metal powder-containing carbon paste 400 at 140° C. for 40 minutes. That is, as shown in FIG. 11B, the production unit places the metal powder-containing carbon paste 400 on a portion to be the connector insertion part 110 of the silver paste 300 printed as a wiring pattern.

Then, the production unit applies the insulated resistor paste 500 (step S104). For example, the production unit prints the insulated resistor paste 500 on a portion to be the cable part 120 of the silver paste 300 printed on the substrate 200 as a wiring pattern and heat-treats the insulated resistor paste 500 at 140° C. for 40 minutes. That is, as shown in FIG. 11C, the production unit places the insulated resistor paste 500 on a portion to be the cable part 120 of the silver paste 300 printed as a wiring pattern.

When step S104 is completed, the silver paste 300 printed as a wiring pattern is covered with the metal powder-containing carbon paste 400 or the insulated resistor paste 500.

Instead of using the insulated resistor paste 500, the production unit may affix an insulating tape. In that case, the production unit performs processing to press the insulating tape using a roll, instead of heating treatment performed after the insulated resistor paste 500 is printed.

The production unit affixes the reinforcing plate 600 to the connector insertion part 110 (step S105) and, the printed wiring board 100 is manufactured by cutting the die to the product shape (step S106) before the manufacturing processing is completed.

According to the first embodiment, as described above, a wiring pattern printed by the silver paste 300 can be covered with the metal powder-containing carbon paste 400 and thus, the value of resistance can be reduced.

For example, when wiring is created on an elastic substrate, for example, a silver paste can be used as a material to create wiring with a low value of resistance. However, there is a possibility here that ion migration may occur as a result of using the silver paste and thus, ion migration is prevented by placing a carbon paste on the silver paste printed as a wiring pattern. Here, the value of resistance of the carbon paste is not low and, as a result, the value of resistance of the connector insertion part increases, making the use of silver paste with a low value of resistance as a material to create wiring with a low value of resistance undesirable.

That is, even when a wiring pattern is created using a conductive paste such as a silver paste showing a low value of resistance, the value of resistance of wiring is determined by the value of resistance of the carbon paste. As a result, it becomes difficult to reduce the value of resistance when a carbon paste is used, reducing the application range of wiring using a conductive paste.

Thus, by using the metal powder-containing carbon paste 400 in the first embodiment, it becomes possible to reduce the value of resistance compared with a printed wiring board using a carbon paste. As a result, the value of resistance can be reduced by using the metal powder-containing carbon paste 400 even if a paste is printed to prevent ion migration, so that the application range of wiring using a conductive paste can be increased.

Moreover, fine particles of a metal that is less likely to cause ion migration than silver is used and thus, ion migration resulting from metal powder contained in the metal powder-containing carbon paste 400 can be prevented.

An embodiment of the present invention has been described, but the present invention may be carried out by other embodiments than the above embodiment. Thus, other embodiments will be described below.

In the first embodiment, for example, a technique to use a nylon mesh as a screen printing plate has been described, but the present invention is not limited to this. For example, a stainless mesh may be used. Accordingly, an excellent printing pattern can be applied so that the silver paste 300 and the metal powder-containing carbon paste 400 can be printed more precisely.

Also in the first embodiment, for example, a case of the two connector insertion parts 110 being provided has been described, but the present invention is not limited to this and one or three or more connector insertion parts 110 may also be provided.

Also in the first embodiment, for example, a technique to use the silver paste 300 as the first conductive paste has been described, but the present invention is not limited to this and, for example, a conductive paste containing a metal other than silver may also be used.

Also in the first embodiment, for example, a technique to use the carbon powder 10 as a conductive material kneaded in the second conductive paste has been described, but the present invention is not limited to this and, for example, it is possible to use a paste created by kneading the metal powder 20, whose particles are smaller than those of the conductive material, in a paste containing a conductive material other than the carbon powder 10.

In the first embodiment, the printed wiring board 100 has been described as an elastic cable, but the present invention is not limited to this and, for example, the printed wiring board 100 may be a substrate on which a CPU or memory is placed.

All or part of processing described as automatically being performed in the present embodiment may manually be performed, or all or part of processing described as manually being performed may automatically be performed. For example, a wiring pattern may be created by manually applying the silver paste 300 to the substrate 200.

Processing procedures, control procedures, concrete names, and information containing various kinds of data and parameters shown herein and drawings (for example, FIGS. 1 to 12) may freely be changed, unless otherwise specified.

Processing to manufacture a printed wiring board described in the present embodiment can be realized by a prepared program being executed by a computer such as a personal computer and workstation to control a production unit. The program can be distributed via a network such as the Internet. The program can also be executed by being recorded in a computer-readable recording medium such as a hard disk, flexible disk (FD), CD-ROM, MO, or DVD and read by a computer from the recording medium.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

We claim:

1. A printed wiring board comprising:
   a first conductive paste configured to form a wiring pattern; and
   a second conductive paste formed by kneading a first conductive material and a second conductive material whose particles are finer than those of the first conductive material, the second conductive material comprising a metal that is less likely to cause ion migration than silver, the second conductive paste being disposed to cover at least a portion of the first conductive paste.

2. The printed wiring board according to claim 1, wherein the first conductive paste comprising a paste of kneaded silver powder, the first conductive material kneaded in the second conductive paste comprises carbon powder, and wherein the second conductive material kneaded in the second conductive paste comprises metal powder.

3. The printed wiring board according to claim 1, wherein the second conductive paste is formed by kneading carbon powder and fine particles of a metal that is less likely to cause ion migration than silver.

4. The printed wiring board according to claim 1, wherein metal powder kneaded in the second conductive paste comprises metal powder of one metal or a plurality of metals selected from nickel, copper, palladium, and cobalt, metal powder of alloys of a plurality of metals selected from nickel, copper, palladium, and cobalt, or metal powder of one metal or a plurality of metals selected from nickel, copper, palladium, cobalt, and the alloys of the plurality of metals.

5. A printed wiring board according to claim 1, further comprising a substrate having said first conductive paste and second conductive paste disposed thereupon.

6. A printed wiring board according to claim 5, wherein said substrate comprises a resin film.

7. A printed wiring board according to claim 6, wherein said resin film comprises polyethylene terephthalate.

8. A printed wiring board according to claim 1, wherein said first conductive paste and said second conductive paste are configured to interact to reduce electrical resistance of one of the first conductive paste and the second conductive paste.

9. A printed wiring board, comprising:
first conductive paste means for forming a wiring pattern on a substrate;
second conductive paste means formed by kneading a first conductive material and a second conductive material, said second conductive material having particles which are smaller than particles of the first conductive material, the second conductive material comprising a metal that is less likely to cause ion migration than silver, said second conductive paste means disposed to cover at least a portion of the first conductive paste means, wherein the first conductive paste means and the second conductive paste means are disposed to interact for reducing electrical resistance of one of the first conductive paste means and the second conductive paste means.

* * * * *